US009825168B2

(12) United States Patent
Lin et al.

(10) Patent No.: US 9,825,168 B2
(45) Date of Patent: Nov. 21, 2017

(54) SEMICONDUCTOR DEVICE CAPABLE OF HIGH-VOLTAGE OPERATION

(71) Applicant: MediaTek Inc., Hsin-Chu (TW)

(72) Inventors: Cheng Hua Lin, Hsinchu (TW); Yan-Liang Ji, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/070,289

(22) Filed: Mar. 15, 2016

(65) Prior Publication Data

US 2016/0351705 A1 Dec. 1, 2016

Related U.S. Application Data

(60) Provisional application No. 62/166,258, filed on May 26, 2015.

(51) Int. Cl.
| | |
|---|---|
| *H01L 29/78* | (2006.01) |
| *H01L 29/06* | (2006.01) |
| *H01L 29/10* | (2006.01) |
| *H01L 29/08* | (2006.01) |
| H01L 29/423 | (2006.01) |
| H01L 29/66 | (2006.01) |

(52) U.S. Cl.
CPC ...... *H01L 29/7816* (2013.01); *H01L 29/0619* (2013.01); *H01L 29/0653* (2013.01); *H01L 29/0696* (2013.01); *H01L 29/0886* (2013.01); *H01L 29/66681* (2013.01); *H01L 29/42368* (2013.01); *H01L 29/665* (2013.01)

(58) Field of Classification Search
CPC ............. H01L 29/7816; H01L 29/1083; H01L 29/063; H01L 29/0653; H01L 29/1095
USPC .................................................. 257/339, 336
See application file for complete search history.

(56) References Cited

U.S. PATENT DOCUMENTS

| | | | | |
|---|---|---|---|---|
| 2010/0109081 A1* | 5/2010 | Chen | ............... | H01L 21/823857 257/336 |
| 2012/0267716 A1* | 10/2012 | Kao | ................... | H01L 29/66689 257/339 |
| 2014/0231908 A1* | 8/2014 | Chen | ................. | H01L 29/66681 257/336 |

* cited by examiner

*Primary Examiner* — Cuong Q Nguyen
*Assistant Examiner* — Tong-Ho Kim
(74) *Attorney, Agent, or Firm* — McClure, Qualey & Rodack, LLP

(57) ABSTRACT

A semiconductor device includes a semiconductor substrate and a first well region formed in the semiconductor substrate. An insulator is formed in and over a portion of the first well region and a second well region is formed in the first well region at a first side of the insulator. A first doped region is formed in the second well region, and a second doped region is formed in the first well region at a second side opposite the first side of the insulator. A gate structure is formed over the insulator, the first well region between the second well region and the insulator, and the second well region. An isolation element is formed in the semiconductor substrate, surrounding the first well region and the second well region. The first and second doped regions are formed with asymmetric configurations from a top view.

12 Claims, 11 Drawing Sheets

SEMICONDUCTOR DEVICE CAPABLE OF HIGH-VOLTAGE OPERATION

CROSS REFERENCE TO RELATED APPLICATIONS

This application claims the benefit of U.S. Provisional Application No. 62/166,258 filed on May 26, 2015, the entirety of which is incorporated by reference herein.

BACKGROUND OF THE INVENTION

Field of the Invention

The present invention relates to integrated circuits (ICs), and in particular to semiconductor devices capable of high-voltage operation.

Description of the Related Art

Recently, as demand has increased for high-voltage devices such as power semiconductor devices, there has been an increasing interest in research on high-voltage metal-oxide-semiconductor field effect transistors (HV MOSFETs) applied in high-voltage devices.

Among the various types of high-voltage metal-oxide-semiconductor field effect transistors (HV MOSFETs), semiconductor devices such as lateral double diffused metal-oxide-semiconductor (LDMOS) devices are often used.

However, with the trend of size reduction in semiconductor fabrication, the critical size of high-voltage MOSFETs for high-voltage devices needs to be reduced further. Thus, a reliable high-voltage MOSFET for high-voltage devices having a reduced size is needed to meet device performance requirements as the needs and trends in size reduction of high-voltage devices continue.

BRIEF SUMMARY OF THE INVENTION

An exemplary semiconductor device comprises a semiconductor substrate having a first conductivity type and a first well region formed in a portion of the semiconductor substrate, having a second conductivity type that is the opposite of the first conductivity type. The semiconductor device further comprises an insulator formed in and over a portion of the first well region and a second well region formed in a portion of the first well region at a first side of the insulator, having the first conductivity type. The semiconductor device further comprises a first doped region formed in a portion of the second well region, having the second conductivity type, and a second doped region formed in a portion of the first well region at a second side opposite the first side of the insulator. The semiconductor device further comprises a gate structure formed over a portion of the insulator, a portion of the first well region between the second well region and the insulator, and a portion of the second well region, and an isolation element formed in the semiconductor substrate, surrounding the first well region and the second well region. In one embodiment, the first and second doped regions are formed with asymmetric configurations from a top view, and the isolation element is in physical contact with the first doped region and the second doped region is isolated from the isolation element by the first well region.

Another exemplary semiconductor device comprises a semiconductor substrate having a first conductivity type, and a first well region formed in a portion of the semiconductor substrate, having a second conductivity type that is the opposite of the first conductivity type. The semiconductor device further comprises a first insulator formed in and over a portion of the first well region, and a second well region formed in a portion of the first well region at a first side of the insulator, having the first conductivity type. The semiconductor device further comprises a first doped region formed in a portion of the second well region, having the second conductivity type, and a second doped region formed in a portion of the first well region at a second side opposite the first side of the insulator. The semiconductor device further comprises a gate structure formed over a portion of the first insulator, a portion of the first well region between the second well region and the first insulator, and a portion of the second well region, and an isolation element formed in the semiconductor substrate, surrounding the first well region and the second well region, wherein the first and second doped regions are formed with asymmetric configurations from a top view and the isolation element is in physical contact with the first doped region. The semiconductor device further comprises a second insulator formed in a portion of the first well region between the second doped region and the isolation element.

Yet another exemplary semiconductor comprises a semiconductor substrate having a first conductivity type, and a first well region formed in a portion of the semiconductor substrate, having a second conductivity type that is the opposite of the first conductivity type. The semiconductor device further comprises an insulator formed in and over a portion of the first well region, and a second well region formed in a portion of the first well region at a first side of the insulator, having the first conductivity type. The semiconductor device further comprises a first doped region formed in a portion of the second well region, having the second conductivity type, and a second doped region formed in a portion of the first well region at a second side opposite the first side of the insulator. The semiconductor device further comprises a gate structure formed over a portion of the insulator, a portion of the first well region between the second well region and the insulator, and a portion of the second well region, and an isolation element formed in the semiconductor substrate, surrounding the first well region and the second well region. In one embodiment, the first and second doped regions are formed with symmetric configurations from a top view, and the isolation element is in physical contact with the first doped region and the second doped region. A cap layer is formed over a portion of the isolation element, a portion of the second doped region adjacent to the portion of the isolation element, and a portion of the insulator adjacent to the second doped region and the isolation element.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
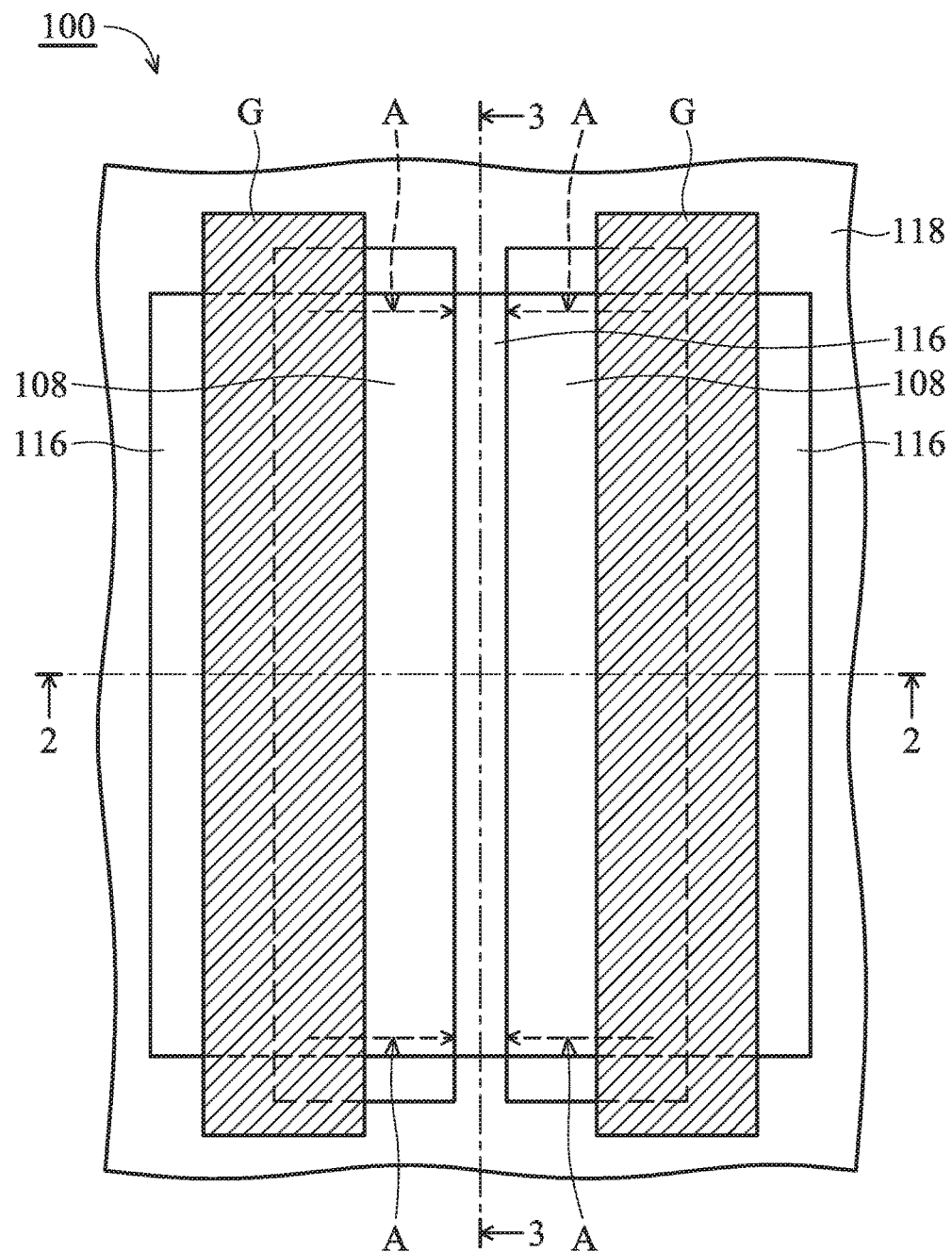
FIG. 1 is schematic top view showing a semiconductor device according to an embodiment of the invention.
Figure 2:
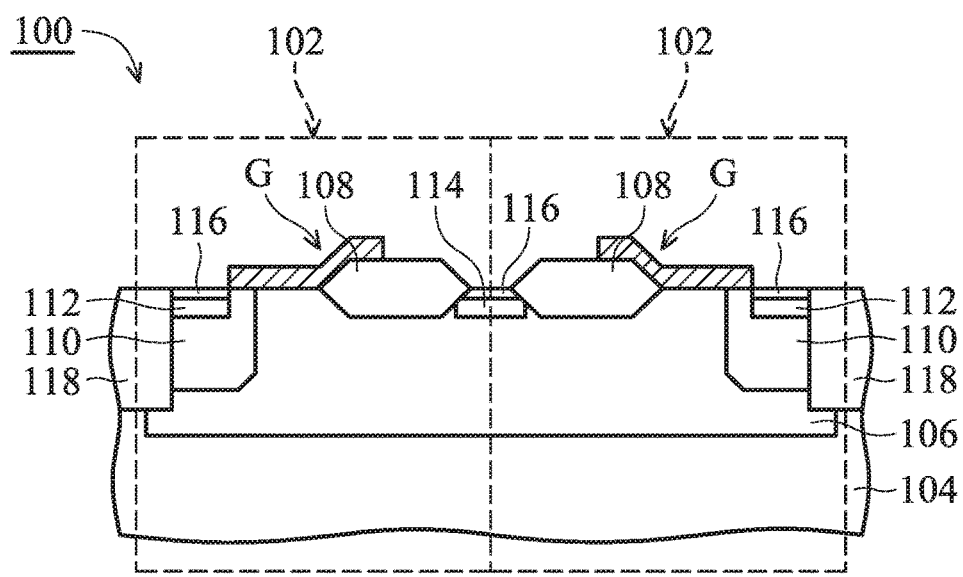
FIG. 2 is a schematic cross-sectional view showing the semiconductor device taken along the line 2-2 in FIG. 1.
Figure 3:
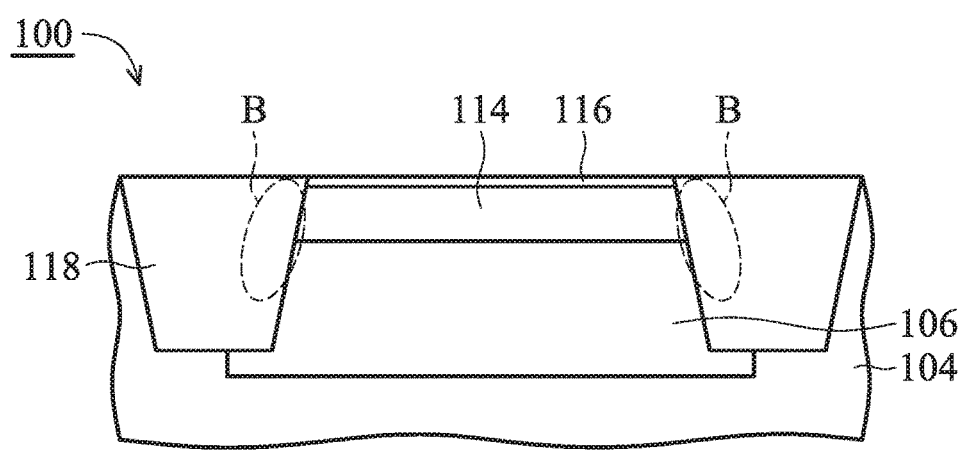
FIG. 3 is a schematic cross-sectional view showing the semiconductor device taken along the line 3-3 in FIG. 1.

FIGS. 1-3 are schematic diagrams showing an exemplary semiconductor device 100 capable of high-voltage operation, for example operation under a voltage of about 5-70 Volts (V) or above. FIG. 1 is a schematic top view showing the semiconductor device 100, and FIGS. 2-3 are schematic cross-sectional views showing the semiconductor device 100 taken along the line 2-2 and the line 3-3 in FIG. 1, respectively.

As shown in FIGS. 1-2, the semiconductor device 100 comprises two metal-oxide-semiconductor (MOS) transistors 102 (see FIG. 2) sharing a common drain region (i.e. the doped region 114). As shown in FIGS. 1 and 2, the MOS transistors 102 are symmetrically disposed and each of the MOS transistors 102 comprises a semiconductor substrate 104 and a well region 106 formed in a portion of the semiconductor substrate 104. In one embodiment, the semiconductor substrate 104 may comprise semiconductor materials such as silicon and may have a first conductivity type, for example P-type, and a dopant concentration of about 1E12-1E13 atoms/cm$^3$. At this time, the well region 106 may have a second conductivity type, for example N-type, which is the opposite of the first conductivity type of the semiconductor substrate 104, and a dopant concentration of about 1E12-1E13 atoms/cm$^3$. Each of the MOS transistors 102 further comprises an insulator 108 formed in and over a portion of the well region 106 and another well region 110 formed in a portion of the well region 106 at a first side (e.g. the left side or right side) of the insulator 108. The well region 110 may have the first conductivity type, for example P-type, and a dopant concentration of about 1E12-1E13 atoms/cm$^3$. The insulator 108 shown in FIGS. 1 and 2 may be a field oxide (FOX) element, and it may be replaced by other insulating structures capable of increasing the operational voltage of the MOS transistors 102 such as shallow trench isolation (STI) elements (not shown). Each of the MOS transistors 102 may further comprise a doped region 112 formed in a portion of the well region 110. The doped region 112 may have the second conductivity type, for example N-type, and a dopant concentration of about 1E12-1E13 atoms/cm$^3$. In one embodiment, the dopant concentration of the doped region 112 is greater than the dopant concentration of the doped region 110. In addition, another doped region 114 is formed in a portion of the well region 106 at a second side (e.g. the right side or left side) opposite the first side of the insulator 108. Each of the MOS transistors 102 further comprises a gate structure G formed over a portion of the insulator 108, a portion of the well region 106 between the second well region 110 and the insulator 108, and a portion of the well region 110. The gate structure G may comprise a dielectric layer and a conductive layer (both not shown) sequentially formed over the semiconductor substrate 104, and the conductive layer of the gate structure G may further extend over a portion of the insulator 108. The conductive layer may comprise conductive materials such as polysilicon. A silicide layer 116 may optionally be formed over the doped regions 112 and 114 to further reduce the contact resistance of the doped regions 112 and 114. In addition, an isolation element 118 is formed in the semiconductor substrate 104 to surround the well region 106 and the well region 112. As shown in FIG. 1, the doped regions 112 and 114 (i.e. the regions under the silicide layer 116) are formed with symmetric configurations from the top view, and the isolation element 118 is in physical contact with the doped regions 112 and 114 (i.e. the regions under the silicide layer 116). In one embodiment, the doped region 114 may function as a drain region of the MOS transistor 102, the doped region 112 may function as a source region of the MOS transistor 102, and the gate structure G may function as a gate of the MOS transistor 102.

Therefore, during the operation of the MOS transistors 102, currents (not shown) may flow from the doped region 112 toward the doped region 114 along a path A shown in FIG. 1. As shown in FIG. 3, some of the electrons (not shown) in the currents flowing along the path A may be somehow trapped in a region B of the isolation element 118 adjacent to the doped region 114, thereby degrading the amount of current flowing in the MOS transistors 102. Thus, degradation of device performance such as linear current leakage (Idlin) of the MOS transistors 102 under a non-conductive stress state (i.e. off-state) of the semiconductor device 100 is then found.

Therefore, an improved semiconductor device capable of high-voltage operation (for example operation under a voltage of about 5-70 volts (V) or more) without the above degradation of device performance (such as linear current leakage, Idlin) of the MOS transistors 102 under a non-conductive stress state (i.e. off-state) of the semiconductor device 100) is needed.

Figure 4:
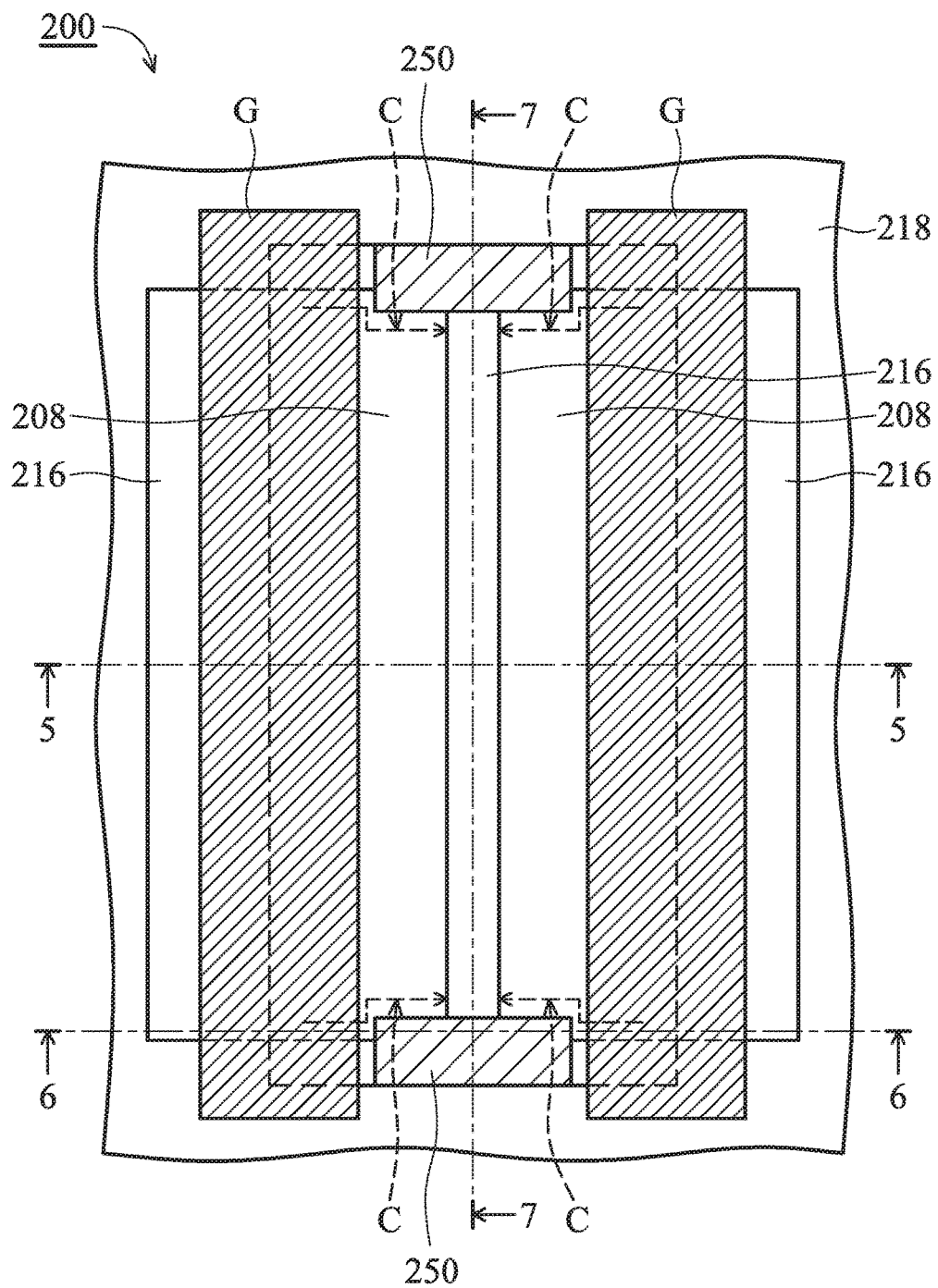
FIG. 4 is schematic top view showing a semiconductor device according to another embodiment of the invention.
Figure 5:
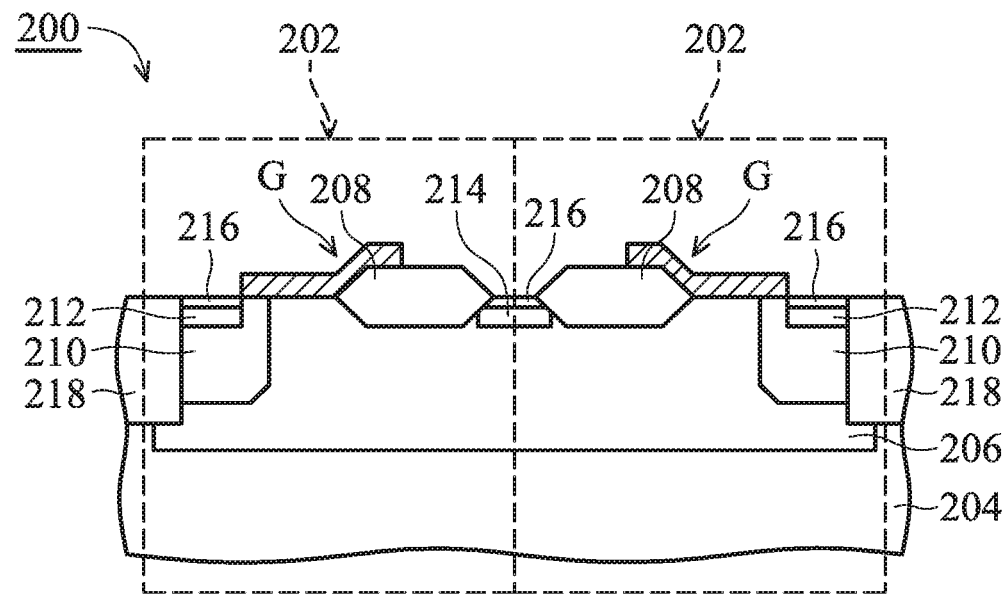
FIG. 5 is a schematic cross-sectional view showing the semiconductor device taken along the line 5-5 in FIG. 4.
Figure 6:
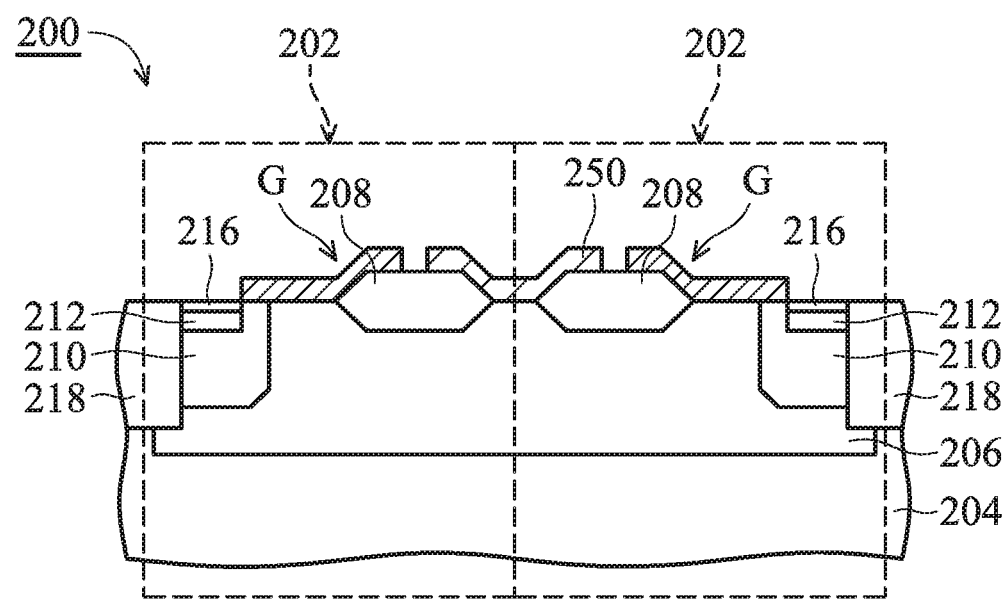
FIG. 6 is a schematic cross-sectional view showing the semiconductor device taken along the line 6-6 in FIG. 4.
Figure 7:
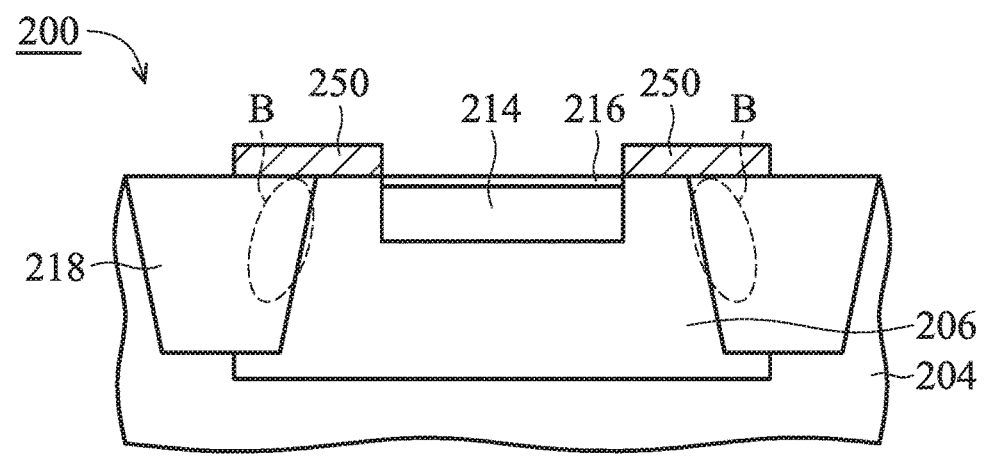
FIG. 7 is a schematic cross-sectional view showing the semiconductor device taken along the line 7-7 in FIG. 4.

FIGS. 4-7 are schematic diagrams showing an exemplary semiconductor device 200 capable of high-voltage operation, for example operation under a voltage of about 5-70 Volts (V) or more. FIG. 4 is a schematic top view showing the semiconductor device 200, and FIGS. 5-7 are schematic cross-sectional views of the semiconductor device 200 taken along the line 5-5, the line 6-6, and the line 7-7 in FIG. 5, respectively.

As shown in FIGS. 4-5, the semiconductor device 200 comprises two metal-oxide-semiconductor (MOS) transistors 202 (see FIG. 4) sharing a common drain region (i.e. the doped region 214). As shown in FIGS. 4, 5, and 6, the MOS transistors 202 are symmetrically disposed and each of the MOS transistors 202 comprises a semiconductor substrate 204 and a well region 206 formed in a portion of the semiconductor substrate 204. In one embodiment, the semiconductor substrate 204 may comprise semiconductor materials such as silicon and may have a first conductivity type, for example P-type, and a dopant concentration of about 1E12-1E13 atoms/cm$^3$. At this time, the well region 206 may have a second conductivity type, for example N-type, which is the opposite of the first conductivity type of the semiconductor substrate 204, and a dopant concentration of about 1E12-1E13 atoms/cm$^3$. Each of the MOS transistors 202 further comprises an insulator 208 formed in and over a portion of the well region 206 and another well region 210 formed in a portion of the well region 206 at a first side (e.g. the left side or right side) of the insulator 208. The well region 210 may have the first conductivity type, for example P-type, and a dopant concentration of about 1E12-1E13 atoms/cm$^3$. The insulator 208 shown in FIGS. 4-6 may be a field oxide (FOX) element, and it may be replaced by other insulating structures such as shallow trench isolation (STI) elements (not shown). Each of the MOS transistors 202 may further comprise a doped region 212 formed in a portion of the well region 210. The doped region 212 may have the second conductivity type, for example N-type, and a dopant concentration of about 1E12-1E13 atoms/cm$^3$. In one embodiment, the dopant concentration of the doped region 212 is greater than the dopant concentration of the doped region 210. In addition, another doped region 214 is formed in a portion of the well region 206 at a second side (e.g. the right side or left side) opposite the first side of the insulator 208. Each of the MOS transistors 202 further comprises a gate structure G formed over a portion of the insulator 208, a portion of the well region 206 between the second well region 210 and the insulator 208, and a portion of the well region 210. The gate structure G may comprise a dielectric layer and a conductive layer (both not shown) sequentially formed over the semiconductor substrate 204, and the conductive layer of the gate structure G may further extend over a portion of the insulator 208. The conductive layer may comprise conductive materials such as polysilicon. A silicide layer 216 may be optionally formed over the doped regions 212 and 214 to further reduce their contact resistance. In addition, an isolation element 218 is formed in the semiconductor substrate 204 to surround the well region 206 and the well region 210.

As shown in FIG. 4, doped regions 212 and 214 (i.e. the regions under the silicide layer 216) are formed with asymmetric configurations from the top view, and the surface area of the doped region 212 is greater than the surface area of the doped region 214. As shown in FIGS. 4 and 7, the doped region 214 is isolated from the isolation element 218 by a portion of the well region 206, and a cap layer 250 is provided over the portion of the well region 206 for isolating the isolation element 218 and the doped region 214. The cap layer 250 may have a structure that is similar to the gate structure G, so that the cap layer 250 and the gate structure G may simultaneously be formed before formation of the doped region 214 and the silicide layer 216. In addition, as shown in FIGS. 4 and 7, the doped regions 212 and 214 are formed with asymmetric configurations, and the doped region 214 is isolated from the isolation element 218 by the portion of the well region 206 such that the isolation element 218 is in physical contact with the doped region 212, but not with the doped region 214. In one embodiment, the doped region 214 may function as a drain region of the MOS transistor 202, the doped region 212 may function as a source of the MOS transistor 202, and the gate structure G may function as a gate of the MOS transistor 202.

Therefore, during the operation of the MOS transistors 202, at the edges next to the drain region of the MOS transistors 202, current may flow from the doped region 212 toward the doped region 214 along a detoured path C shown in FIG. 4. As shown in FIG. 7, the doped region 214 is isolated from the isolation element 218 by the portion of the well region 206 under the cap layer 250, and the portion of the well region 206 under the cap layer 250 is now free from the doped region 214 and the silicide layer 216, such that the portion of the well region 206 under the cap layer 250 is less conductive than the doped region 214 and the silicide layer 216. Accordingly, fewer electrons (not shown) of the current will flow through the region adjacent to both the isolation element 218 and the well region 206 under the cap layer 250, so that fewer electrons will be trapped in a region B of the isolation element 218 adjacent to the well region 206 under the cap layer 250 and between the isolation element 218 and the doped region 214. Therefore, degradation of the amount of the currents flowing in the transistors 202 is reduced or even prevented, and degradation of device performance such as linear current leakage (Idlin) of the MOS transistors 202 under a non-conductive stress state (i.e. off-state) of the semiconductor device 200 is also reduced or even prevented.

Figure 8:
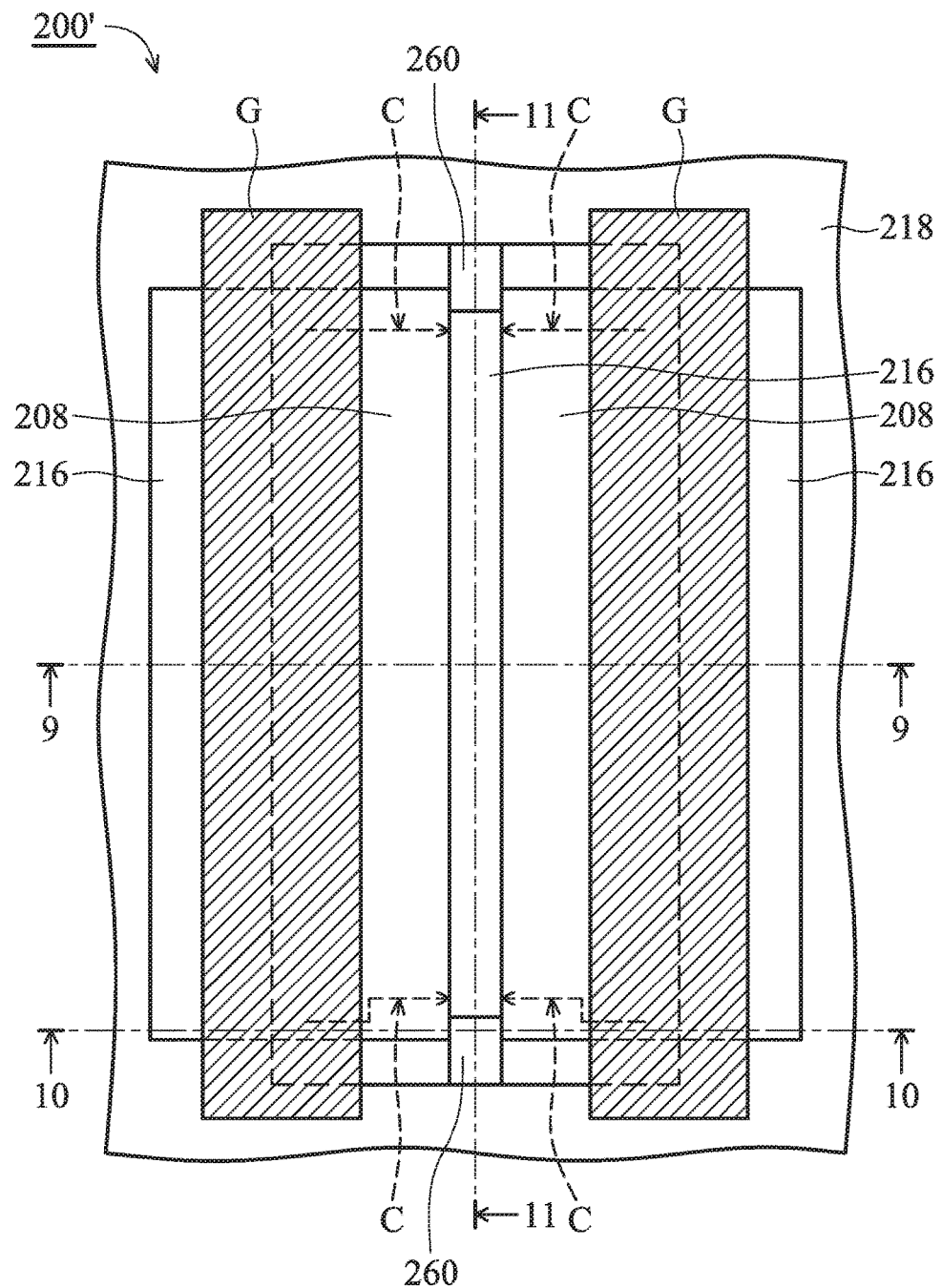
FIG. 8 is schematic top view showing a semiconductor device according to yet another embodiment of the invention.
Figure 9:
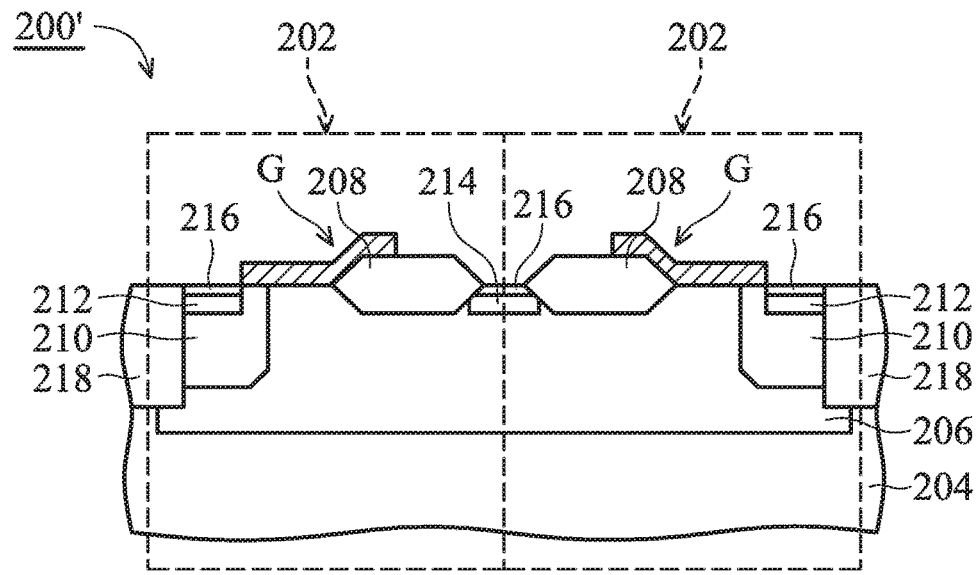
FIG. 9 is a schematic cross-sectional view showing the semiconductor device taken along the line 9-9 in FIG. 8.
Figure 10:
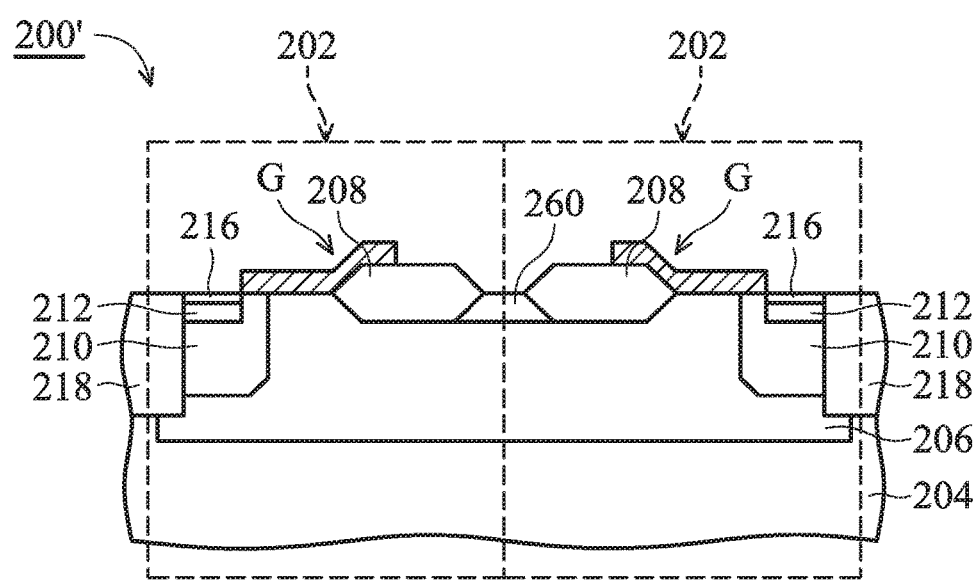
FIG. 10 is a schematic cross-sectional view showing the semiconductor device taken along the line 10-10 in FIG. 8.
Figure 11:
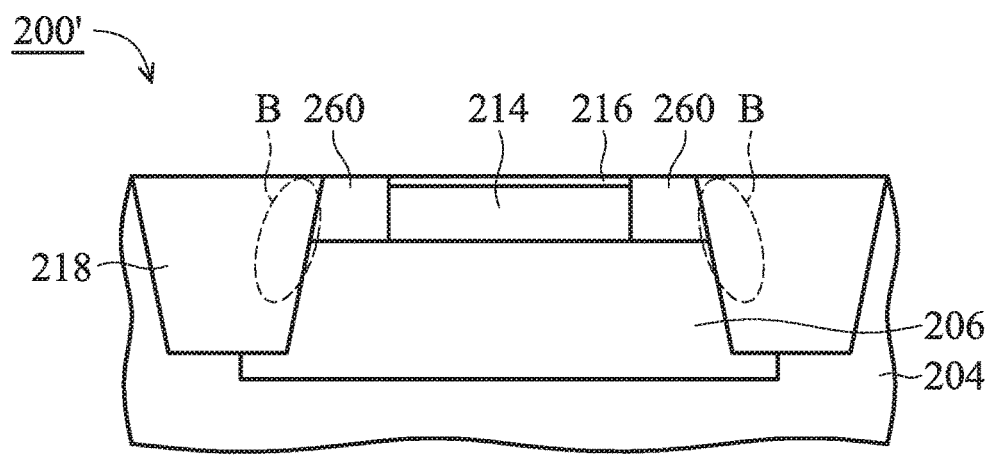
FIG. 11 is a schematic cross-sectional view showing the semiconductor device taken along the line 11-11 in FIG. 8.

In addition, FIGS. 8-11 are schematic diagrams showing another exemplary semiconductor device 200' capable of high-voltage operation, for example operation under a voltage of about 5-70 volts (V) or more. The semiconductor device 200' shown in FIGS. 8-11 is modified from the semiconductor device 200 shown in FIGS. 4-7. FIG. 8 is a schematic top view showing the semiconductor device 200', and FIGS. 9-11 are schematic cross-sectional views of the semiconductor device 200' taken along the line 9-9, the line 10-10, and the line 11-11 in FIG. 8, respectively. For the purpose of simplicity, the same reference numbers in FIGS. 8-11 and FIGS. 4-7 represent the same components, and only differences between the semiconductor devices 200 and 200' are discussed as bellows.

As shown in FIGS. 8-11, the cap layer 250 shown in FIGS. 4-7 is replaced by an insulator 260 formed in a portion of the well region 206 adjacent to the isolation element 218. The insulator 260 is adjacent to the insulator 208 in each of the MOS transistors 202 and can be simultaneously formed with the insulator 208. The insulator 260 is also formed in a portion of the well region 206 between the doped region 214 and the isolation element 208. Similarly, as shown in FIGS. 8 and 11, since the doped regions 212 and 214 are formed with asymmetric configurations and the doped region 214 is isolated from the isolation element 218 by the insulator 260, such that the isolation element 218 is in physical contact with the doped region 212, but not with the doped region 214. Therefore, during the operation of the MOS transistors 202, at the edges next to the drain of the MOS transistors 202, a current may flow from the doped region 212 toward the doped region 214 along a detoured path C shown in FIG. 8. As shown in FIG. 11, since the doped region 214 is isolated from the isolation element 218 by the insulator 260, and the insulator 260 is non-conductive when compared with the doped region 214, such that there is an insulating area formed between the isolation element 218 and the doped region 214. Accordingly, no electron (not shown) of the current will flow through the region adjacent to both the isolation element 218 and the insulator 260 adjacent thereto, such that no electron will be trapped in a region B of the isolation element 218 adjacent to the insulator 260 and between the isolation element 218 and the doped region 214. Accordingly, degrading the amount of current flowing in the MOS transistors 202 is reduced or even prevented, and degradation of device performance such as linear current leakage (Idlin) of the transistors 202 under a non-conductive stress state (i.e. off-state) of the semiconductor device 200' is also reduced or even prevented.

Figure 12:
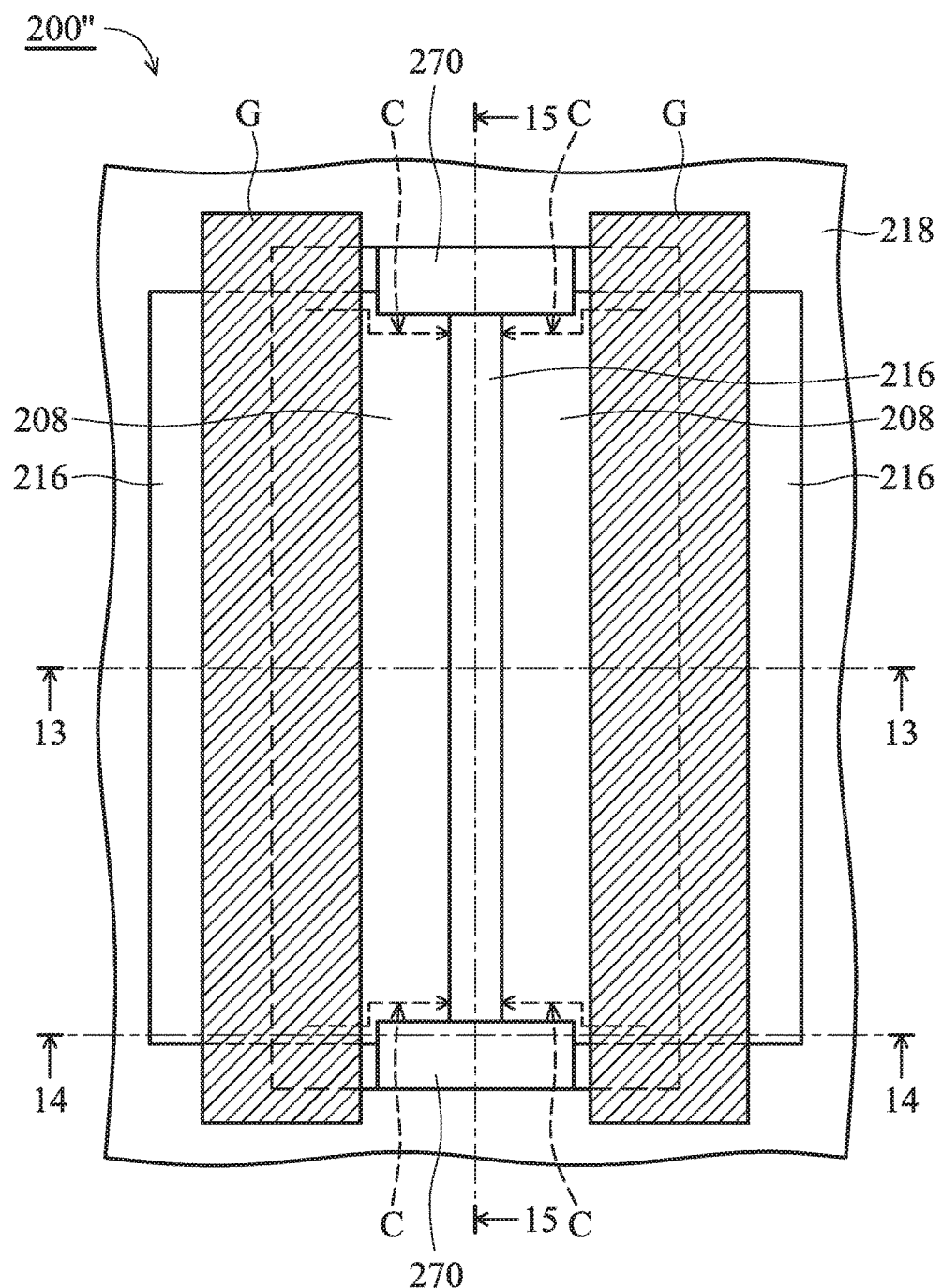
FIG. 12 is schematic top view showing a semiconductor device according to another embodiment of the invention.
Figure 13:
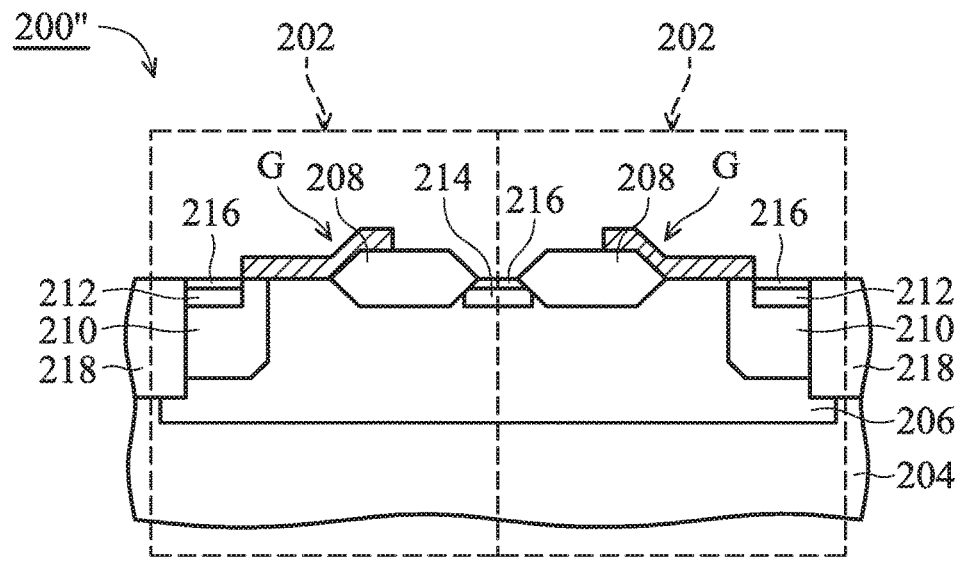
FIG. 13 is a schematic cross-sectional view showing the semiconductor device taken along the line 13-13 in FIG. 12.
Figure 14:
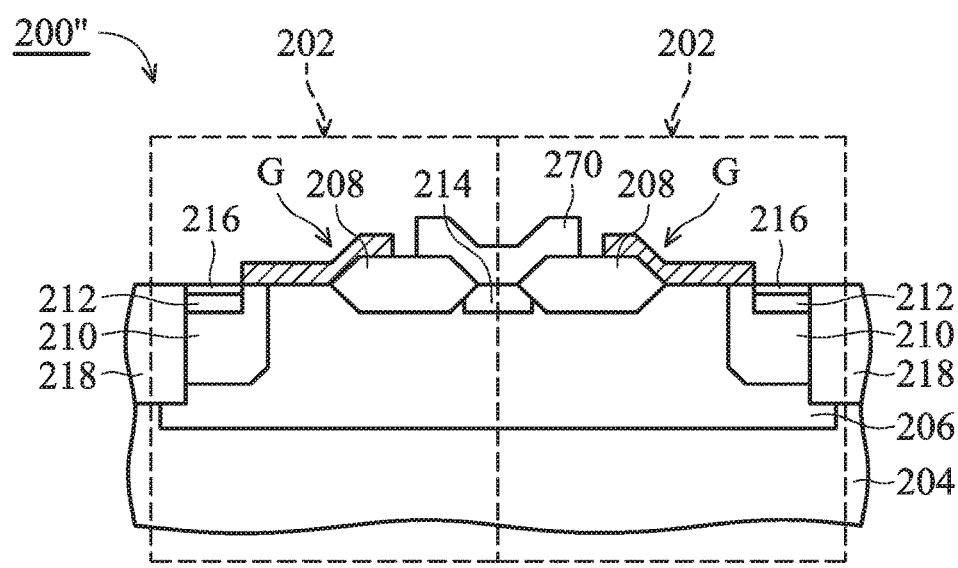
FIG. 14 is a schematic cross-sectional view showing the semiconductor device taken along the line 14-14 in FIG. 12.
Figure 15:
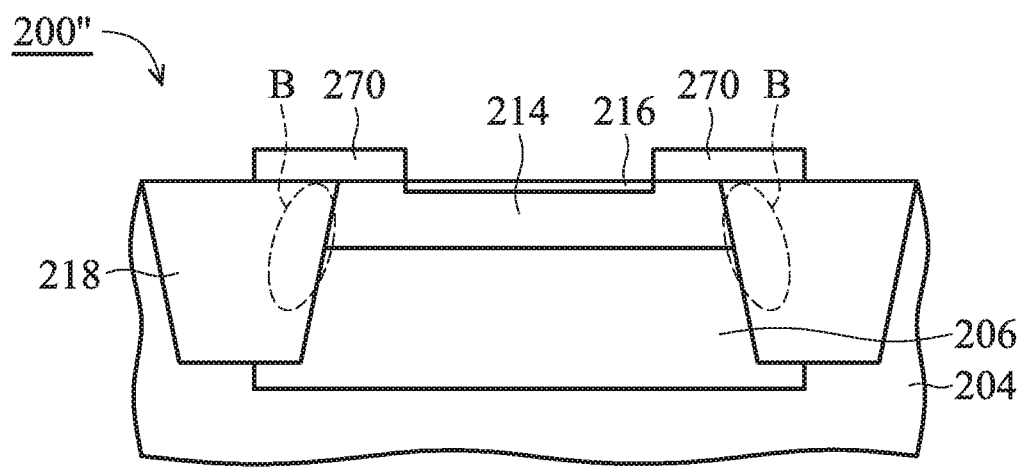
FIG. 15 is a schematic cross-sectional view showing the semiconductor device taken along the line 15-15 in FIG. 12.

In addition, FIGS. 12-15 are schematic diagrams showing another exemplary semiconductor device 200'' capable of high-voltage operation, for example operation under a voltage of about 5-70 volts (V) or more. The semiconductor device 200'' shown in FIGS. 12-15 is modified from the semiconductor device 200 shown in FIGS. 4-7. FIG. 12 is a schematic top view showing the semiconductor device 200'', and FIGS. 13-15 are schematic cross-sectional views of the semiconductor device 200'' taken along the line 13-13, the line 14-14, and the line 15-15 in FIG. 13, respectively. For the purpose of simplicity, the same reference numbers in FIGS. 13-15 and FIGS. 4-7 represent the same components, and only differences between the semiconductor devices 200 and 200'' are discussed below.

As shown in FIGS. 12-15, the cap layer 250 shown in FIGS. 4-7 is now replaced by a cap layer 270 formed over a portion of the well region 206 adjacent to the isolation element 218. The cap layer 270 is formed over the insulator 208 and can be a cap layer for defining areas of forming the silicide layer 216. In the semiconductor device 200'', the doped regions 212 and 214 are now formed with symmetric configurations, and the isolation element 218 is in physical contact with the doped regions 212 and 214, as shown in FIGS. 12-14. Similarly, as shown in FIGS. 12 and 15, the portion of the doped region 214 adjacent to the isolation element 218 is covered by the cap layer 260 and is free from silicide layer 216 formed thereover. Therefore, it is less conductive than other regions of the doped region 214 having the silicide layer 216 formed thereover. Accordingly, fewer electrons (not shown) of the current will flow through the region adjacent to both the isolation element and the doped region 214 under the cap layer 270, so that fewer electrons will be trapped in a region B of the isolation element 218 adjacent to the doped region 214 under the cap layer 270 and between the isolation element 218 and portions of the doped region 214 having the silicide layer 216 formed thereover. Therefore, degradation of the amount of current flowing in the MOS transistors 202 is reduced or even prevented, and degradation of device performance such as linear current leakage (Idlin) of the MOS transistors 202 under a non-conductive stress state (i.e. off-state) of the semiconductor device 200 is also reduced or even prevented.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor substrate having a first conductivity type;
a first well region formed in a portion of the semiconductor substrate, having a second conductivity type that is the opposite of the first conductivity type;
an insulator formed in and over a portion of the first well region;
a second well region formed in a portion of the first well region at a first side of the insulator, having the first conductivity type;
a first doped region formed in a portion of the second well region, having the second conductivity type;
a second doped region formed in a portion of the first well region at a second side opposite the first side of the insulator;
a gate structure formed over a portion of the insulator, a portion of the first well region between the second well region and the insulator, and a portion of the second well region;
an isolation element formed in the semiconductor substrate, surrounding the first well region and the second well region, wherein the first and second doped regions are formed with asymmetric configurations from a top view, and the isolation element is in physical contact with the first doped region and the second doped region is isolated from the isolation element by the first well region; and
a cap layer formed over a portion of the isolation element and a portion of the second doped region adjacent to the portion of the isolation element, wherein the cap layer is separated from the gate structure.

2. The semiconductor device as claimed in claim 1, wherein the cap layer comprises a dielectric layer and a conductive layer sequentially formed over the portion of the second doped region adjacent to the portion of the isolation element.

3. The semiconductor device as claimed in claim 1, wherein the second doped region has a surface area less than a surface area of the first doped region.

4. The semiconductor device as claimed in claim 1, further comprising a silicide layer formed over the first and second doped regions.

5. The semiconductor device as claimed in claim 1, wherein the insulator is a field oxide (FOX) element or a shallow trench isolation (STI) element.

6. The semiconductor device as claimed in claim 1, wherein the isolation element is a shallow trench isolation (STI) element and a bottom surface of the first well region is below a top surface of the isolation element.

7. The semiconductor device as claimed in claim 1, wherein the first doped region is a source region and the second doped region is a drain region.

8. A semiconductor device, comprising:
a semiconductor substrate having a first conductivity type;
a first well region formed in a portion of the semiconductor substrate, having a second conductivity type that is the opposite of the first conductivity type;
an insulator formed in and over a portion of the first well region;
a second well region formed in a portion of the first well region at a first side of the insulator, having the first conductivity type;
a first doped region formed in a portion of the second well region, having the second conductivity type;
a second doped region formed in a portion of the first well region at a second side opposite the first side of the insulator;
a gate structure formed over a portion of the insulator, a portion of the first well region between the second well region and the insulator, and a portion of the second well region;
an isolation element formed in the semiconductor substrate, surrounding the first well region and the second well region, wherein the first and second doped regions are formed with symmetric configurations from a top view, and the isolation element is in physical contact with the first doped region and the second doped region; and a cap layer formed over a portion of the isolation element, a portion of the second doped region adjacent to the portion of the isolation element, and a portion of the insulator adjacent to the second doped region and the isolation element, wherein the cap layer is separated from the gate structure.

9. The semiconductor device as claimed in claim 8, further comprising a silicide layer formed over the first doped region and a portion of the second doped region not covered by the cap layer.

10. The semiconductor device as claimed in claim 8, wherein the insulator is a field oxide (FOX) element or a shallow trench isolation (STI) element.

11. The semiconductor device as claimed in claim 8, wherein the isolation element is a shallow trench isolation (STI) element.

12. The semiconductor device as claimed in claim 8, wherein the first doped region is a source region and the second doped region is a drain region.

* * * * *